(12) United States Patent  
Tachibana et al.

(10) Patent No.: US 9,142,717 B2  
(45) Date of Patent: Sep. 22, 2015

(54) SEMICONDUCTOR LIGHT EMITTING DEVICE AND WAFER

(75) Inventors: Koichi Tachibana, Kanagawa-ken (JP); Shigeya Kimura, Kanagawa-ken (JP); Hajime Nago, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 13/206,700

(22) Filed: Aug. 10, 2011

(65) Prior Publication Data

US 2012/0286284 A1   Nov. 15, 2012

(30) Foreign Application Priority Data

May 13, 2011   (JP) .................................. 2011-108794

(51) Int. Cl.
*H01L 33/00* (2010.01)
*H01L 21/00* (2006.01)
(Continued)

(52) U.S. Cl.
CPC ................. *H01L 33/12* (2013.01); *B82Y 20/00* (2013.01); *H01L 33/007* (2013.01); *H01L 33/06* (2013.01); *H01L 33/08* (2013.01); *H01L 33/20* (2013.01); *H01L 33/22* (2013.01); *H01L 33/32* (2013.01); *H01S 5/3407* (2013.01); *H01S 5/34333* (2013.01); *H01S 2301/173* (2013.01); *H01S 2304/04* (2013.01); *H01S 2304/12* (2013.01)

(58) Field of Classification Search
CPC ....... H01L 33/06; H01L 33/32; H01L 33/007; H01L 33/22; H01L 33/20; H01S 2304/12; H01S 5/3407
See application file for complete search history.

(56) References Cited

U.S. PATENT DOCUMENTS 7,033,854 B2 *  4/2006  Morita ............................ 438/40
8,274,069 B2 *  9/2012  Chung et al. .................... 257/13
(Continued)

FOREIGN PATENT DOCUMENTS

JP   6-268314   9/1994
JP   10-41545   2/1998
(Continued)

OTHER PUBLICATIONS

Office Action issued Feb. 10, 2012, in Japanese Patent Application No. 2011-108794 (with English-language translation).
(Continued)

*Primary Examiner* — Alonzo Chambliss
(74) *Attorney, Agent, or Firm* — Oblon, McClelland, Maier & Neustadt, L.L.P.

(57) ABSTRACT

According to one embodiment, a semiconductor light emitting device includes: a foundation layer, a first semiconductor layer, a light emitting part, and a second semiconductor layer. The foundation layer includes a nitride semiconductor. The foundation layer has a dislocation density not more than $5\times10^8$ cm$^{-2}$. The first semiconductor layer of a first conductivity type is provided on the foundation layer and includes a nitride semiconductor. The light emitting part is provided on the first semiconductor layer. The light emitting part includes: a plurality of barrier layers; and a well layer provided between the barrier layers. The well layer has a bandgap energy smaller than a bandgap energy of the barrier layers and has a thickness larger than a thickness of the barrier layers. The second semiconductor layer of a second conductivity type different from the first conductivity type, is provided on the light emitting part and includes a nitride semiconductor.

12 Claims, 4 Drawing Sheets

(51) Int. Cl.
H01L 33/12 (2010.01)
B82Y 20/00 (2011.01)
*H01L 33/20* (2010.01)
*H01L 33/22* (2010.01)
*H01L 33/06* (2010.01)
*H01L 33/08* (2010.01)
*H01L 33/32* (2010.01)
*H01S 5/34* (2006.01)
*H01S 5/343* (2006.01)

(56) References Cited

U.S. PATENT DOCUMENTS

| | | | | |
|---|---|---|---|---|
| 8,674,338 | B2 * | 3/2014 | Tachibana et al. | 257/13 |
| 2006/0091408 | A1 * | 5/2006 | Kim et al. | 257/94 |
| 2010/0163901 | A1 * | 7/2010 | Fudeta | 257/98 |
| 2010/0288999 | A1 * | 11/2010 | Kikuchi et al. | 257/13 |
| 2010/0327311 | A1 * | 12/2010 | Kaji et al. | 257/103 |
| 2011/0062479 | A1 * | 3/2011 | Sugano et al. | 257/98 |
| 2011/0073892 | A1 * | 3/2011 | Kyono | 257/98 |
| 2011/0095331 | A1 * | 4/2011 | Hanawa et al. | 257/99 |
| 2012/0298952 | A1 * | 11/2012 | Hikosaka et al. | 257/13 |

FOREIGN PATENT DOCUMENTS

| | | |
|---|---|---|
| JP | 10-261838 | 9/1998 |
| JP | 11-68158 | 3/1999 |
| JP | 2002-93726 | 3/2002 |
| JP | 2002-184707 | 6/2002 |
| JP | 2002-223042 | 8/2002 |
| JP | 2002-252422 A | 9/2002 |
| JP | 2003-22973 A | 1/2003 |
| JP | 2005-19872 | 1/2005 |
| JP | 2005-45153 | 2/2005 |
| JP | 2005-259827 | 9/2005 |
| JP | 2007-134507 | 5/2007 |
| JP | 2007-246341 A | 9/2007 |
| JP | 2009-88270 A | 4/2009 |

OTHER PUBLICATIONS

U.S. Appl. No. 13/030,440, filed Feb. 18, 2011, Koichi Tachibana, et al.
U.S. Appl. No. 12/871,285, filed Aug. 30, 2010, Toshiki Hikosaka, et al.
Notification of Reason(s) for Refusal issued Nov. 22, 2011, in Japanese Patent Application No. 2011-108794 (with English translation).
Notification of Reason(s) for Refusal issued Jun. 24, 2013 in Japanese Patent Application No. 2012-011345 (with English translation).
Office Action mailed on Apr. 9, 2014, in Japanese Patent Application No. 2012-011345 (with English-language translation).
Japanese Office Action (Trial Decision) dated Apr. 17, 2015, issued in Japanese Patent Application No. 2012-11345 (with English translation).

* cited by examiner

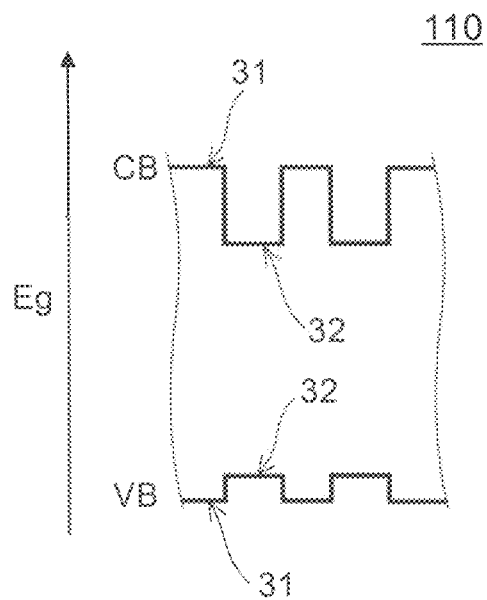 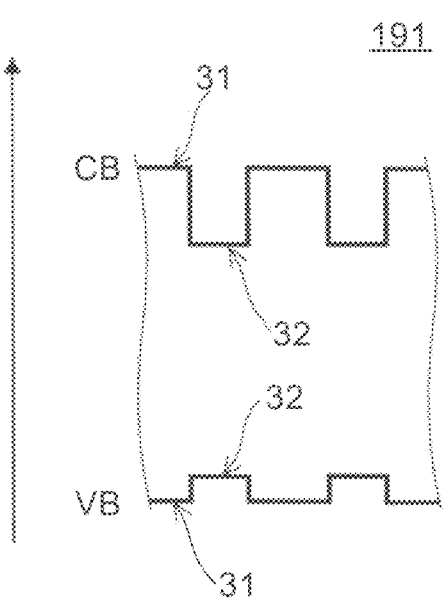
FIG. 3A  FIG. 3B
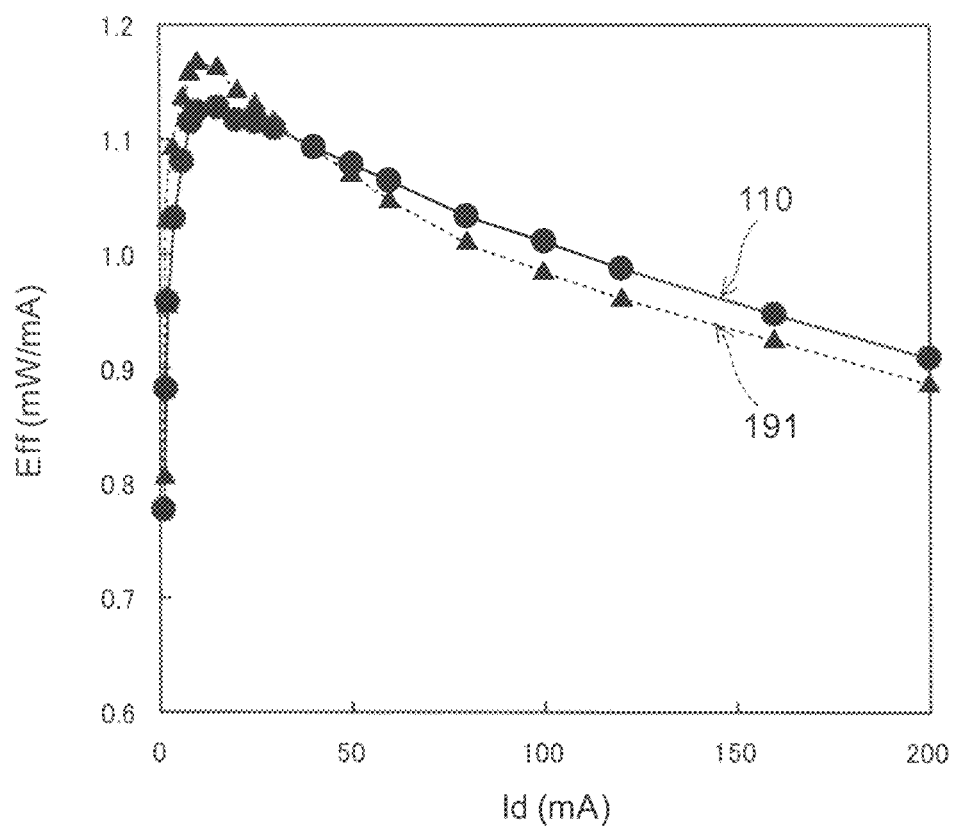
FIG. 4

to be an X-axis. An axis perpendicular to the Z-axis and the X-axis

SEMICONDUCTOR LIGHT EMITTING DEVICE AND WAFER

CROSS-REFERENCE TO RELATED APPLICATIONS

This application is based upon and claims the benefit of priority from the prior Japanese Patent Application No. 2011-108794, filed on May 13, 2011; the entire contents of which are incorporated herein by reference.

FIELD

Embodiments described herein relate generally to a semiconductor light emitting device, and a wafer.

BACKGROUND

A semiconductor light emitting device using a nitride semiconductor such as gallium nitride (GaN) or the like is applied to high luminance ultraviolet, blue and green light-emitting diodes (LEDs) or ultraviolet, blue and green laser diodes (LDs) and the like.

In such semiconductor light emitting device, an improvement in light emission efficiency has been desired.

BRIEF DESCRIPTION OF THE DRAWINGS

FIG. 3A and FIG. 3B are energy band diagrams illustrating configurations of the semiconductor light emitting devices;

FIG. 4 is a graph illustrating characteristics of the semiconductor light emitting devices;

DETAILED DESCRIPTION

Figure 1:
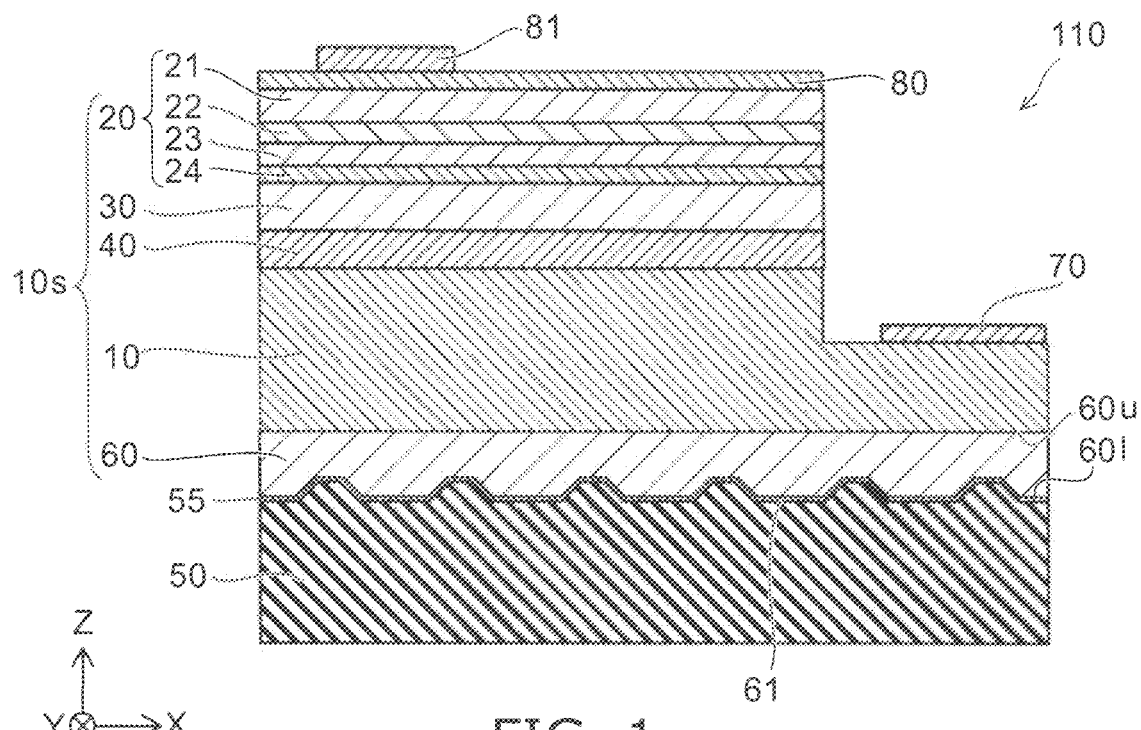
FIG. 1 is a schematic cross-sectional view illustrating a configuration of a semiconductor light emitting device according a first embodiment.

In general, according to one embodiment, a semiconductor light emitting device includes: a foundation layer, a first semiconductor layer, a light emitting part, and a second semiconductor layer. The foundation layer includes a nitride semiconductor. The foundation layer has a dislocation density not more than $5 \times 10^8$ cm$^{-2}$. The first semiconductor layer of a first conductivity type is provided on the foundation layer and includes a nitride semiconductor. The light emitting part is provided on the first semiconductor layer. The light emitting part includes: a plurality of barrier layers; and a well layer provided between the barrier layers. The well layer has a bandgap energy smaller than a bandgap energy of the barrier layers and has a thickness larger than a thickness of the barrier layers. The second semiconductor layer of a second conductivity type different from the first conductivity type, is provided on the light emitting part and includes a nitride semiconductor.

According to one embodiment, a wafer includes: a foundation layer, a first semiconductor layer, a light emitting part, and a second semiconductor layer. The foundation layer includes a nitride semiconductor. The foundation layer has a dislocation density not more than $5 \times 10^8$ cm$^{-2}$. The first semiconductor layer of a first conductivity type is provided on the foundation layer and includes a nitride semiconductor. The light emitting part is provided on the first semiconductor layer. The light emitting part includes: a plurality of barrier layers; and a well layer provided between the barrier layers. The well layer has a bandgap energy smaller than a bandgap energy of the barrier layers and have a thickness larger than a thickness of the barrier layers. The second semiconductor layer of a second conductivity type different from the first conductivity type, is provided on the light emitting part and includes a nitride semiconductor.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

The embodiment relates to semiconductor light emitting devices such as LEDs and LDs. In the following, an LED as one example of a semiconductor light emitting device according to the embodiment will be described. FIG. 1 is a schematic cross-sectional view illustrating a configuration of a semiconductor light emitting device according a first embodiment.

As shown in FIG. 1, a semiconductor light emitting device 110 according to the embodiment includes a foundation layer 60, a first semiconductor layer 10, a second semiconductor layer 20 and a light emitting part 30.

The foundation layer 60 has a lower face 60*l* and an upper face 60*u*. The upper face 60*u* is a face on a side opposite to the lower face. The foundation layer 60 includes a nitride semiconductor.

The first semiconductor layer 10 is provided on the upper face 60*u* of the foundation layer 60. The first semiconductor layer 10 includes a nitride semiconductor. The first semiconductor layer 10 has a first conductivity type.

The light emitting part 30 is provided on the first semiconductor layer 10. An example of the light emitting part 30 will be described later.

The second semiconductor layer 20 is provided on the light emitting part 30. The second semiconductor layer 20 includes a nitride semiconductor. The second semiconductor layer 20 has a second conductivity type. The second conductivity type is different from the first conductivity type.

For example, the first conductivity type is an n-type, and the second conductivity type is a p-type. However, the embodiment is not limited to this, and the embodiment is practicable also in the case where the first conductivity type is the p-type and the second conductivity type is the n-type. In the following, descriptions will be given in the case where the first conductivity type is the n-type, and the second conductivity type is the p-type.

Here, an axis perpendicular to the lower face 60*l* (or the upper face 60*u*) of the foundation layer 60 is assumed to be a Z-axis. One axis perpendicular to the Z-axis is assumed to be an X-axis. An axis perpendicular to the Z-axis and the X-axis is assumed to be a Y-axis. A direction from the foundation layer 60 toward the first semiconductor layer 10 corresponds to an upper direction. The Z-axis is parallel to the stacking direction of a stacked structure body 10s including the first semiconductor layer 10, the light emitting part 30 and the second semiconductor layer 20.

In this specification, "stacked layers" include the case where layers are stacked with other layer(s) provided in therebetween, other than the case where layers are stacked so as to mutually contact each other.

In the example, the semiconductor light emitting device 110 further includes a substrate 50. For the substrate 50, for example, a sapphire substrate (for example, a c-plane sapphire substrate) is used. However, other than the sapphire substrate, for example, GaN, SiC, ZnO or Si substrate may be used for the substrate 50.

For the foundation layer 60, for example, a GaN layer is used. An impurity concentration in the foundation layer 60 is lower than an impurity concentration in the first semiconductor layer 10. Specifically, for example, an undoped GaN layer is used for the foundation layer 60. A thickness of the foundation layer 60 is, for example, approximately 3 micrometers (μm). A dislocation density in the foundation layer 60 is not more than $5 \times 10^8$ cm$^{-2}$. More preferably, the dislocation density in the foundation layer 60 is not more than $4 \times 10^8$ cm$^{-2}$.

The stacked structure body 10s may further include a buffer layer 55. The buffer layer 55 is provided between the substrate 50 and the foundation layer 60. For the buffer layer 55, for example, an undoped GaN layer is used. The buffer layer 55 includes, for example, $Ga_{x1}Al_{1-x1}N$ ($0.1 \leq x1 \leq 0.5$). A thickness of the buffer layer 55 is, for example, not less than 20 nanometers (nm) and not more than 50 nm.

On the substrate 50, the buffer layer 55 is formed, and the foundation layer 60, the first semiconductor layer 10, the light emitting part 30 and the second semiconductor layer 20 are formed thereon in this order. After forming the stacked structure body 10s on the substrate 50, the substrate 50 may be removed. When removing the substrate 50, at least a part of the buffer layer 55 and at least a part of the foundation layer 60 may be removed.

The foundation layer 60, for example, has protrusions and recessions 61 provided on the lower face 60l. The protrusions and recessions 61 are formed on the lower face 60l of the foundation layer 60, for example, by providing the protrusions and recessions on a major surface of the substrate 50, and forming thereon the buffer layer 55 and the foundation layer 60 as described above. The concave portions of the protrusions and recessions 61 of the foundation layer 60 face the convex portions of the protrusions and recessions of the substrate 50. The convex portions of the protrusions and recessions 61 of the foundation layer 60 face the concave portions of the protrusions and recessions of the substrate 50. The protrusions and recessions 61 of the foundation layer 60 are along the shape of the protrusions and recessions of the substrate 50. The protrusions and recessions of the substrate 50 have a plurality of convex portions. Each of the plurality of convex portions, for example, has a diameter of 3 μm, and is formed in a cylindrical shape (circular truncated cone shape) with a height of 1 μm. The plurality of convex portions is aligned at pitches of, for example, 5 μm.

The protrusions and recessions of the substrate 50, and the protrusions and recessions 61 of the foundation layer 60 are provided as needed, and may be omitted.

For example, n-type impurities are added to the first semiconductor layer 10. For the n-type impurities, for example, Si, Ge, Sn, and the like are used. In the following, descriptions will be given for the case of using Si. The GaN layer having Si added thereto is used for the first semiconductor layer. An amount of doped Si is, for example, approximately $5 \times 10^{18}$ cm$^{-3}$. A thickness of the first semiconductor layer 10 is, for example, approximately 5 μm. At least a part of the first semiconductor layer 10 functions as an n-type cladding layer.

The second semiconductor layer 20 includes a first p-type layer 21, a second p-type layer 22, a third p-type layer 23 and a fourth p-type layer 24. The light emitting part 30 is provided between the first p-type layer 21 and the first semiconductor layer 10. The second p-type layer 22 is provided between the first p-type layer 21 and the light emitting part 30. The third p-type layer 23 is provided between the second p-type layer 22 and the light emitting part 30. The fourth p-type layer 24 is provided between the third p-type layer 23 and the light emitting part 30. The p-type impurity is added to the first p-type layer 21, the second p-type layer 22, the third p-type layer 23 and the fourth p-type layer 24. For the p-type impurity, for example, Mg, Zn, or the like is used. In the following, descriptions will be given for the case of using Mg as the p-type impurity.

For example, a p-type GaN layer is used for the fourth p-type layer 24. The fourth p-type layer 24 functions, for example, as a first guide layer. A thickness of the fourth p-type layer 24 is, for example, 30 nm. An Mg concentration in the fourth p-type layer 24 is, for example, approximately $4 \times 10^{18}$ cm$^{-3}$. When the p-type GaN layer is used for the fourth p-type layer 24, a formation temperature of the fourth p-type layer 24 is, for example, not less than 1000° C. and not more than 1100° C.

Moreover, for the fourth p-type layer 24, an $In_{0.01}Ga_{0.99}N$ layer (for example, 30 nm in thickness) may be used. In this case, the formation temperature of the fourth p-type layer 24 is not less than 700° C. and not more than 800° C.

For the third p-type layer 23, for example, a p-type $Ga_{0.8}Al_{0.2}N$ layer is used. The third p-type layer 23 functions, for example, as an electron overflow preventing (suppressing) layer. A thickness of the third p-type layer 23 is, for example, approximately 10 nm. An Mg concentration in the third p-type layer 23 is set to, for example, approximately $4 \times 10^{18}$ cm$^{-3}$.

For the second p-type layer 22, for example, the p-type GaN layer is used. The second p-type layer 22 functions, for example, as a second guide layer. A thickness of the second p-type layer 22 is, for example, approximately 50 nm. An Mg concentration in the second p-type layer 22 is, for example, approximately $1 \times 10^{19}$ cm$^{-3}$.

For the first p-type layer 21, for example, the p-type GaN layer is used. The first p-type layer 21 functions as a p-side contact layer. A thickness of the first p-type layer 21 is, for example, approximately 60 nm. Mg is added to the first p-type layer 21 with a concentration higher than the Mg concentration in the second p-type layer 22. An Mg concentration in the first p-type layer 21 is set to, for example, approximately $1 \times 10^{20}$ cm$^{-3}$.

As illustrated in FIG. 1, in this example, the semiconductor light emitting device 110 further includes a multilayer structure body 40. The multilayer structure body 40 is provided between the first semiconductor layer 10 and the light emitting part 30. The multilayer structure body 40 includes a plurality of first layers (not shown) and a plurality of second layers (not shown) alternately stacked along the Z axis. For the first layer, for example, the GaN layer with a thickness of 3 nm is used. For the second layer, for example, an $In_{0.05}Ga_{0.95}N$ layer with a thickness of 1 nm is used. For example, 30 pairs of the first layer and the second layer are stacked. The multilayer structure body 40 is, for example, a superlattice layer.

The semiconductor light emitting device 110 may further include a first electrode 70, a second electrode 80 and a p-side pad layer 81. The first electrode 70 is electrically connected to the first semiconductor layer 10. The second electrode 80 is electrically connected to the second semiconductor layer 20. The p-side pad layer 81 is provided on the second electrode 80.

For the first electrode 70, for example, a stacked film of a Ti film, a Pt film and an Au film is used. A thickness of the Ti film is, for example, 0.05 μm. A thickness of the Pt film is, for example, 0.05 μm. A thickness of the Au film is, for example, 1.0 μm.

For the second electrode 80, for example, an indium oxide (for example, indium tin oxide: ITO) film is used. A thickness of the second electrode 80 is, for example, 0.2 μm.

For the p-side pad layer 81, for example, an Au film is used. The thickness of the p-side pad layer 81 is, for example, 1.0 μm.

In this example, the stacked structure body 10s is disposed such that a part of the first semiconductor layer 10 and the second semiconductor layer 20 are exposed from the major surface on the side of the second semiconductor layer 20. The first electrode 70 and the second electrode 80 are respectively connected to the first semiconductor layer 10 and the second semiconductor layer 20 on the side of the major surface.

With an applied voltage across the first electrode 70 and the second electrode 80, current is supplied to the light emitting part 30 via the first semiconductor layer 10 and the second semiconductor layer 20. Thereby, light emits from the light emitting part 30.

Figure 2:
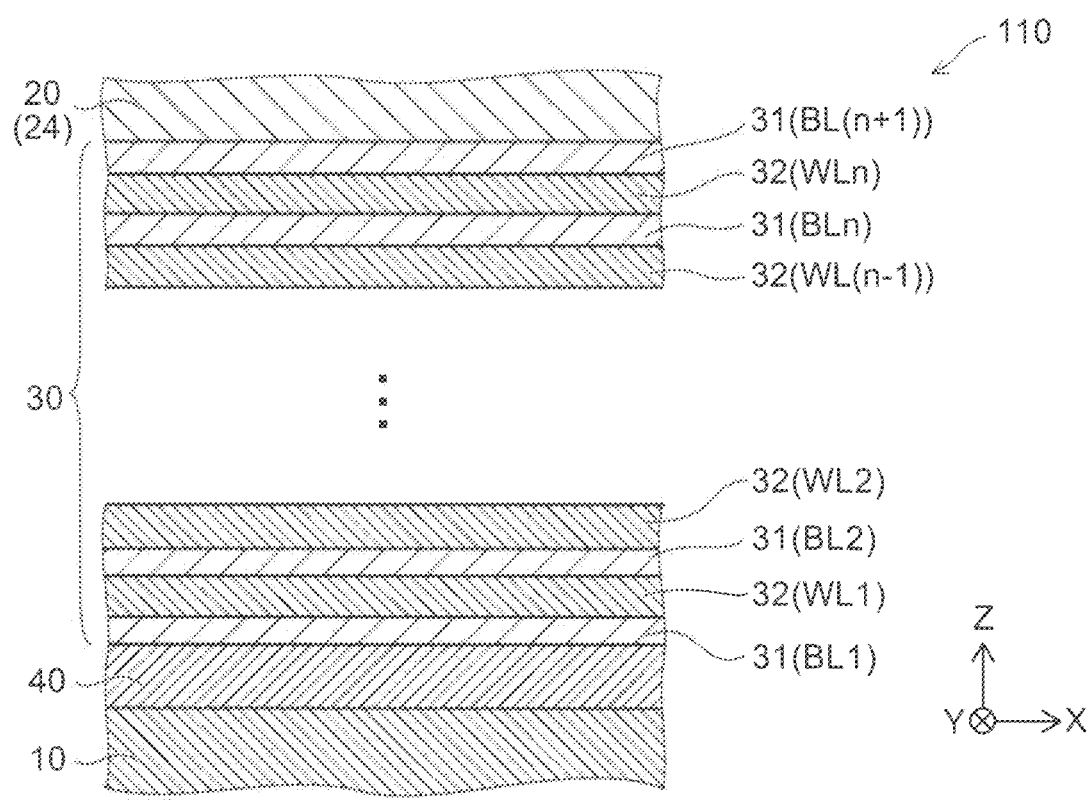
FIG. 2 is a schematic cross-sectional view illustrating a configuration of a part of the semiconductor light emitting device according to the first embodiment.

FIG. 2 is a schematic cross-sectional view illustrating a configuration of a part of the semiconductor light emitting device according to the first embodiment.

As shown in FIG. 2, the light emitting part 30 includes a plurality of well layers 32 and a plurality of barrier layers 31. Each of the barrier layers 31 is provided between the well layers 32. Namely, the plurality of well layers 32 and the plurality of barrier layers 31 are stacked alternately along the Z-axis.

The well layer 32 has a bandgap energy smaller than a bandgap energy of the plurality of barrier layers 31. The well layer 32 is thicker than the thickness of the plurality of barrier layers 31.

The well layer 32, for example, includes $In_{x1}Ga_{1-x1}N$ ($0<x1<1$). The barrier layer 31, for example, includes GaN. Namely, the barrier layer 31 does not substantially contain In. Additionally, when the barrier layer 31 contains In, an In composition ratio in the barrier layer 31 is lower than an In composition ratio in the well layer 32.

The light emitting part 30 may have a multiple quantum well (MQW) structure. In this case, the light emitting part 30 includes three or more barrier layers 31 and the well layers 32. Each of the well layers 32 is provided between the barrier layers 31.

The light emitting part 30 includes (n+1) barrier layers 31 and n well layers 32 ("n" is an integer of 2 or more). The $(i+1)^{th}$ barrier layer BL(i+1) is disposed between the $i^{th}$ barrier layer BLi and the second semiconductor layer 20 ("i" is an integer of not less than 1 and not more than (n−1)). The $(i+1)^{th}$ well layer WL(i+1) is disposed between the $i^{th}$ well layer WLi and the second semiconductor layer 20. The first barrier layer BL1 is provided between the first semiconductor layer 10 and the first well layer WL1. The $n^{th}$ well layer WLn is provided between the $n^{th}$ barrier layer BLn and the $(n+1)^{th}$ barrier layer BL(n+1). The $(n+1)^{th}$ barrier layer BL(n+1) is provided between the $n^{th}$ well layer WLn and the second semiconductor layer 20.

A peak wavelength of the light (emitted light) emitted from the light emitting part 30 is, for example, not less than 400 nanometer (nm) and not more than 650 nm.

FIG. 3A and FIG. 3B are energy band diagrams illustrating configurations of the semiconductor light emitting devices.

FIG. 3A illustrates an energy band of the semiconductor light emitting device 110 according to the embodiment, and FIG. 3B illustrates an energy band of a semiconductor light emitting device 191 of a first reference example. In these diagrams, a valance band VB and a conduction band CB are illustrated. The horizontal axis indicates a position along the Z-axis direction, and the vertical axis indicates energy Eg of electrons.

As illustrated in FIG. 3B, in the semiconductor light emitting device 191 of the first reference example, the well layer 32 is thinner than the barrier layer 31.

In contrast, in the semiconductor device 110 according to the embodiment, the well layer 32 is thicker than the barrier layer 31 as shown in FIG. 3A.

The semiconductor light emitting device 110 and the semiconductor light emitting device 191 were actually fabricated, and results of evaluation on respective characteristics are described hereinbelow. In the following, a manufacturing method of the semiconductor light emitting device 110 will be described as one example of the method of manufacturing the semiconductor light emitting device according to the embodiment.

On the substrate 50 made of sapphire, the stacked structure body 10s was formed. As a method of forming the stacked structure body 10s, Metal-Organic Chemical Vapor Deposition (MOCVD) was used. Other than the MOCVD, a crystal growth may be performed by the Molecular Beam Epitaxy (MBE).

Namely, first, the buffer layer 55 was formed on the substrate 50. Specifically, the $Ga_{0.4}Al_{0.6}N$ layer (approximately 30 nm) serving as the buffer layer 55 was deposited at a rate (i.e., deposition rate) of not more than 0.1 μm/hour. In this example, a crystal growth temperature of the buffer layer 55 (the temperature of the substrate 50) was approximately 500° C. A formation temperature of the buffer layer 55 is, for example, lower than 800° C. It is preferably not more than approximately 600° C. The buffer layer 55 is a low temperature growth buffer layer.

Then, on the buffer layer 55, the foundation layer 60, the first semiconductor layer 10, the light emitting part 30 and the second semiconductor layer 20 were formed in this order. The formation temperatures of these nitride semiconductor layers are higher than the formation temperature of the buffer layer 55.

Specifically, on the buffer layer 55, an undoped GaN layer serving as the foundation layer 60 was formed at 800° C.

Further, on the foundation layer 60, a Si-doped GaN layer serving as the first semiconductor layer 10 was formed. A formation temperature of the first semiconductor layer 10 is 1100° C.

On the first semiconductor layer 10, 30 pairs in total of the first layer (a GaN layer with a thickness of 3 nm) and the second layer ($In_{0.05}Ga_{0.95}N$ layer with a thickness of 1 nm) were stacked as the multilayer structure body 40. The formation temperature for this process is not less than 700° C. and not more than 800° C.

On the multilayer structure body 40, the plurality of barrier layers 31 and the plurality of well layers 32 were formed alternately as the light emitting part 30. Namely, the GaN layers (3 nm in thickness) serving as the barrier layers 31 and undoped $In_{0.14}Ga_{0.86}N$ layers (3.5 nm in thickness) serving as the well layers 32 were stacked alternately. The number of the well layers 32 was eight. The formation temperatures of the barrier layers 31 and the well layers 32 are approximately not less than 700° C. and not more than 800° C.

As a result, the light emitting part 30 having a peak wavelength of a photoluminescence of 450 nm at room temperature is formed.

On the light emitting part 30, the p-type GaN layer (approximately 30 nm in thickness) serving as the fourth p-type layer 24 was formed. The formation temperature for this process is not less than 1000° C. and not more than 1100° C.

On the fourth p-type layer 24, a $Ga_{0.8}Al_{0.2}N$ layer (approximately 10 nm in thickness) serving as the third p-type layer 23 was formed. The formation temperature for this process is not less than 1000° C. and not more than 1100° C.

On the third p-type layer 23, the p-type GaN layer (approximately 50 nm in thickness) serving as the second p-type layer was formed. The formation temperature for this process is not less than 1000° C. and not more than 1100° C.

On the second p-type layer 22, the p-type GaN layer (approximately 60 nm in thickness) serving as the first p-type layer 21 was formed. The formation temperature for this process is not less than 1000° C. and not more than 1100° C.

Thereafter, the first electrode 70, the second electrode 80 and the p-side pad layer 81 were formed. Thereby, the semiconductor light emitting device 110 was fabricated.

For the first reference example, the same process as the above process was performed except that the thickness of the barrier layer 31 was set to approximately 5 nm when forming the light emitting part 30. As a result, the semiconductor light emitting device 191 was fabricated. Namely, in the semiconductor light emitting device 191, for the barrier layer 31, the GaN layer with a thickness of 5 nm was used, and for the well layer 32, the undoped $In_{0.14}Ga_{0.86}N$ layer with a thickness of 3.5 nm was used.

FIG. 4 is a graph illustrating characteristics of the semiconductor light emitting devices.

Specifically, the graph shows the results of measurements on the characteristics of the semiconductor light emitting device 110 according to the embodiment and the semiconductor light emitting device 191 of the first reference example. In the graph, the horizontal axis indicates current Id to be supplied, and the vertical axis indicates the light emission efficiency Eff.

As can be seen from FIG. 4, in case of the semiconductor light emitting device 191 of the first reference example, although the light emission efficiency Eff is high when the current Id of approximately 20 mA is supplied, the light emission efficiency Eff is significantly lowered as the current Id is increased.

In contrast, in the case of the semiconductor light emitting device 110 according to the embodiment, the light emission efficiency is maintained high even when a larger current Id than approximately 20 mA is supplied. In the region where the current Id of approximately not less than 50 mA is supplied, higher light emission efficiency Eff than the semiconductor light emitting device 191 is obtained.

As described, according to the semiconductor light emitting device 110, high light emission efficiency Eff is obtained particularly in the large current region. It is considered that the reason is that holes are sufficiently introduced also into the well layer 32 on the side of the first semiconductor layer 10 among the plurality of well layers 32 of the light emitting part 30 by setting the thickness of the barrier layer 31 thinner than the well layer 32.

Figure 5A:
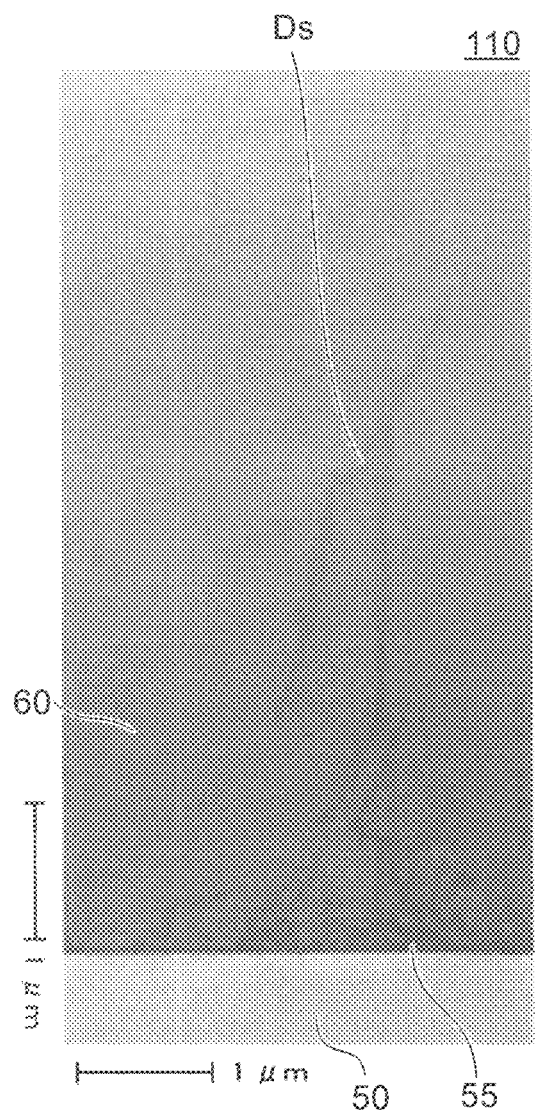
FIGS. 5A and 5B show microscope images illustrating characteristics of the semiconductor light emitting device.
Figure 5B:
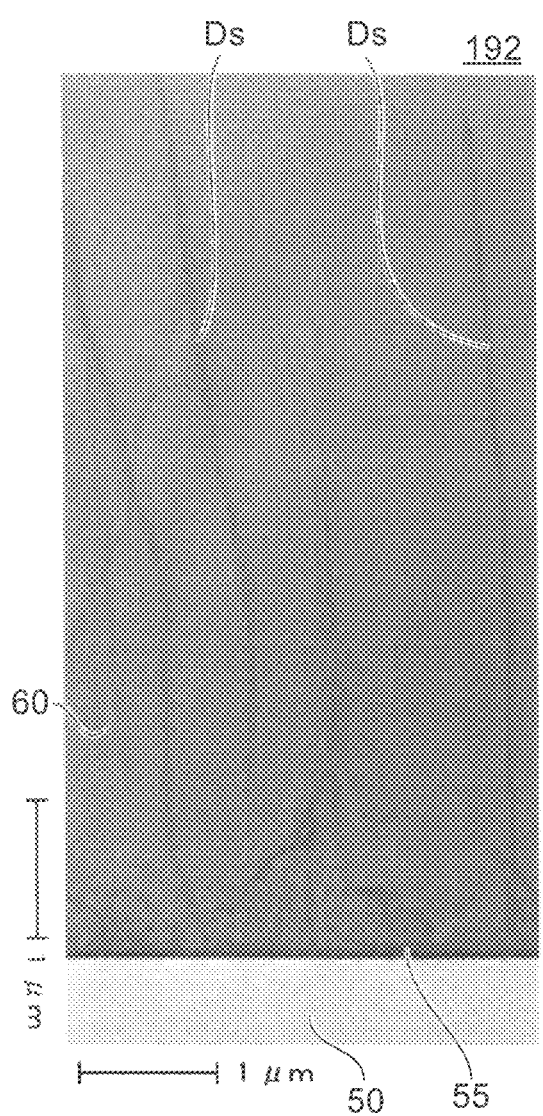

FIGS. 5A and 5B show microscope images illustrating characteristics of the semiconductor light emitting device.

FIG. 5A is a cross-sectional view by a TEM (Transmission Electron Microscopy) of the foundation layer 60 in the semiconductor light emitting device 110 according to the embodiment. FIG. 5B is a cross-sectional view by the TEM of the foundation layer 60 in a semiconductor light emitting device 192 (not shown) of a second reference example.

In the semiconductor light emitting device 192 of the second reference example, a condition of the buffer layer 55 is different from that of the semiconductor light emitting device 110. Namely, in the semiconductor light emitting device 192, on the substrate 50, the $Ga_{0.4}Al_{0.6}N$ layer (approximately 30 nm) serving as the buffer layer 55 was deposited at a deposition rate of 0.25 μm/hour. At this time, the crystal growth temperature of the buffer layer 55 is approximately 500° C., is same as in the case of the semiconductor light emitting device 110. For other conditions (the foundation layer 50, the first semiconductor layer 10, the light emitting part 30, and the second semiconductor layer 20 and the like) than the above are the same as the semiconductor light emitting device 110.

In the light emitting part 30 of the semiconductor light emitting device 192, for example, the GaN layer (3 nm in thickness) is used for the barrier layer 31, and the undoped $In_{0.14}Ga_{0.86}N$ layer (3.5 nm in thickness) is used for the well layer 32. The well layer 32 is thicker than the barrier layer 31.

As shown in FIG. 5A, few dislocations Ds were generated in the foundation layer 60 of the semiconductor light emitting device 110 according to the embodiment. A dislocation density in the foundation layer 60 of the semiconductor light emitting device 110 was approximately $4 \times 10^8$ cm$^{-2}$.

As shown in FIG. 5B, quite a lot of dislocations Ds are generated in the foundation layer 60 of the semiconductor light emitting device 192 of the second reference example. The dislocation density in the foundation layer 60 of the semiconductor light emitting device 192 is approximately $1 \times 10^9$ cm$^{-2}$.

As described, according to the embodiment, the dislocation density becomes not more than one half of the dislocation density of the second reference example. Such difference is affected by the difference in condition of forming the above buffer layer 55.

In the semiconductor light emitting device 192 of the second reference example having a high dislocation density, the light emission efficiency Eff is low. This is because the quality of the light emitting part 30 is low due to a high dislocation density in the foundation layer 60. Namely, in the state where the foundation layer 60 has high dislocation density, if the thickness of the well layer 32 is set thicker than the barrier layer 31, the crystalline in the light emitting part 30 would deteriorate.

Therefore, in the semiconductor light emitting device using the nitride semiconductor, in order to make the well layer 32 thicker than the barrier layer 31, it is necessary to set the dislocation density in the foundation layer 60 low.

In the embodiment, the dislocation density in the foundation layer 60 is set not more than $5 \times 10^8$ cm$^{-2}$. As a result, it is possible to maintain desirable crystalline even when the thickness of the well layer 32 is set larger than the thickness of the barrier layer 31, thereby obtaining high light emission efficiency Eff. In the embodiment, it is more preferable that the dislocation density in the foundation layer 60 be not more than $4 \times 10^8$ cm$^{-2}$.

As described, in the semiconductor light emitting device 110 according to the embodiment, the foundation layer 60 having low dislocation density and the well layer 32 thicker than the barrier layer 31 are combined. As a result, it is possible to, for example, improve the efficiency of injecting holes from the second semiconductor layer 20 into the well layers 32, and to obtain high quantum efficiency even in the high current density region. Thereby, high light emission efficiency can be obtained.

Second Embodiment

The embodiment relates to a wafer for semiconductor light emitting devices such as LEDs and LDs.

Figure 6:
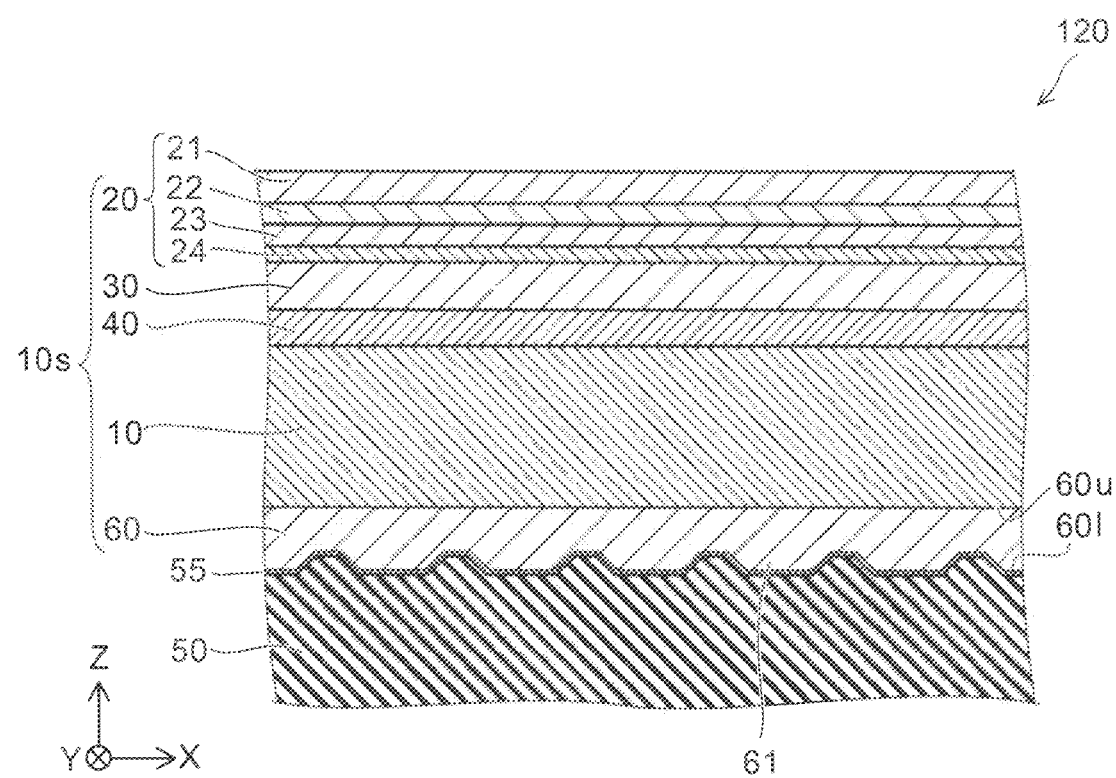
FIG. 6 is a schematic cross-sectional view illustrating a configuration of a wafer according to the second embodiment.

FIG. 6 is a schematic cross-sectional view illustrating a configuration of a wafer according to the second embodiment.

As shown in FIG. 6, a wafer 120 according to the embodiment includes the foundation layer 60 including the nitride semiconductor, the foundation layer 60 having a dislocation density not more than $5\times10^8$ cm$^{-2}$; the first semiconductor layer 10 of the first conductivity type provided on the foundation layer 60 and including the nitride semiconductor; the light emitting part 30 provided on the first semiconductor layer 10, the light emitting part 30 including the plurality of barrier layers 31 and the well layer 32 provided between the barrier layers 31 and having a bandgap energy smaller than a bandgap energy of the plurality of barrier layers 31 and a thickness larger than a thickness of the plurality of barrier layers 31; and the second semiconductor layer 20 of the second conductivity type different from the first conductivity type, provided on the light emitting part 30 and including the nitride semiconductor.

As to respective configurations of the foundation layer 60, the first semiconductor layer 10, the light emitting part 30 and the second semiconductor layer 20 of the embodiment, the configurations described with reference to the first embodiment can be applied.

According to the wafer 120 of the embodiment, it is possible to improve the efficiency of injecting holes from the second semiconductor layer 20 into the well layers 32 while maintaining high crystalline, which in turn makes it possible to realize a semiconductor light emitting device which permits high quantum efficiency even in the high current density region. As a result, high light emission efficiency can be obtained.

The wafer 120 according to the embodiment may further include the substrate 50 provided on the foundation layer 60 on a side opposite to the first semiconductor layer 10. On the substrate 50, protrusions and recessions may be provided, and therefore, the foundation layer 60 may have the protrusions and recessions 61.

In the wafer 120 according to the embodiment, it is preferable that the dislocation density in the foundation layer 60 be, for example, not more than $4\times10^8$ cm$^{-2}$. Additionally, the impurity concentration in the foundation layer 60 is lower than the impurity concentration in the first semiconductor layer 10.

The wafer 120 according to the embodiment may further include the buffer layer 55. In this case, the foundation layer is disposed between the buffer layer 55 and the first semiconductor layer 10. The buffer layer 55 includes, for example, $Ga_{x1}Al_{1-x1}N$ ($0.1 \leq x1 < 0.5$). The buffer layer 55 has a thickness, for example, not less than 20 nm and not more than 50 nm.

According to the embodiment, a semiconductor device and a wafer with high light emission efficiency can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices and wafers such as semiconductor layers, light emitting parts, foundation layers, buffer layers, substrates, and electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices and wafers practicable by an appropriate design modification by one skilled in the art based on the semiconductor light emitting devices and the wafers described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a foundation layer including a nitride semiconductor, the foundation layer having a dislocation density not more than $5\times10^8$ cm$^{-2}$;
   a first semiconductor layer of a first conductivity type provided on the foundation layer and including a nitride semiconductor;
   a light emitting part provided on the first semiconductor layer, the light emitting part including:
      a first well layer;
      a second well layer; and
      a barrier layer provided between the first well layer and the second well layer, the barrier layer contacting the first well layer and the second well layer, the first well layer having a first bandgap energy smaller than a bandgap energy of the barrier layer, the second well layer having a second bandgap energy smaller than the bandgap energy of the barrier layer, the first well layer having a first face opposing the barrier layer, the second well layer having a second face opposing the barrier layer, the first well layer having a first thickness larger than a distance between the first face and the second face, the second well layer having a second thickness larger than the distance; and a second semiconductor layer of a second conductivity type different from the first conductivity type, provided on the light emitting part and including a nitride semiconductor, a light emission efficiency of the device having a maximum efficiency value at a first current value of a current flowing between the first semiconductor layer and the second semiconductor layer, the light emission efficiency of the device having a second efficiency value at a second current value of the current, the second current value being ten times the first current value, and the second efficiency value being not less than 82% of the maximum efficiency value.

2. The device according to claim 1, wherein the dislocation density in the foundation layer is not more than $4\times10^8$ cm$^{-2}$.

3. The device according to claim 1, wherein the distance is not less than 0.5 nanometers and not more than 3 nanometers.

4. The device according to claim 1, wherein each of the first thickness and the second thickness is not less than 3.2 nanometers.

5. The device according to claim 1, wherein the foundation layer has protrusions and recessions provided on a lower face of the foundation layer on a side opposite to the first semiconductor layer.

6. The device according to claim 1, wherein an impurity concentration in the foundation layer is lower than an impurity concentration in the first semiconductor layer.

7. The device according to claim 1, wherein the foundation layer includes an undoped GaN layer.

8. The device according to claim 1, further comprising:
a buffer layer,
the foundation layer being disposed between the buffer layer and the first semiconductor layer, and the buffer layer including $Ga_{x1}Al_{1-x1}N$ ($0.1 \leq x1 \leq 0.5$).

9. The device according to claim 8, wherein the thickness of the buffer layer is not less than 20 nanometers and not more than 50 nanometers.

10. The device according to claim 8, wherein the buffer layer includes an undoped GaN layer.

11. The device according to claim 8, wherein a formation temperature of the buffer layer is lower than 800° C.

12. The device according to claim 1, wherein a peak wavelength of light emitted from the light emitting part is not less than 400 nanometers and not more than 650 nanometers.

* * * * *